United States Patent [19]

Nakagawa et al.

[11] Patent Number: 5,731,603
[45] Date of Patent: Mar. 24, 1998

[54] LATERAL IGBT

[75] Inventors: Akio Nakagawa, Hiratsuka; Tomoko Matsudai; Hideyuki Funaki, both of Tokyo, all of Japan

[73] Assignee: Kabushiki Kaisha Toshiba, Kawasaki, Japan

[21] Appl. No.: 701,500

[22] Filed: Aug. 22, 1996

[30] Foreign Application Priority Data

Aug. 24, 1995 [JP] Japan .................... 7-216350

[51] Int. Cl.[6] .............. H01L 29/74; H01L 31/111; H01L 27/01
[52] U.S. Cl. .................. 257/141; 257/140; 257/350
[58] Field of Search .................. 257/139, 140, 257/141, 144, 162, 163, 335, 341, 401, 350

[56] References Cited

U.S. PATENT DOCUMENTS

| | | | |
|---|---|---|---|
| 4,823,172 | 4/1989 | Mihara | 257/144 |
| 5,089,864 | 2/1992 | Sakurai | 257/144 |

FOREIGN PATENT DOCUMENTS

| | | |
|---|---|---|
| 0 094 891 | 11/1983 | European Pat. Off. |
| 0 280 535 | 8/1988 | European Pat. Off. |
| 40 06 886 | 9/1990 | Germany |
| 41 04 588 | 8/1991 | Germany |

OTHER PUBLICATIONS

Sumida et al., "Modified structure of the lateral IGBT on SOI ...", IEEE on electron devices Feb. 1995.
Patent Abstracts of Japan, vol. 014, No. 324, Jul. 11, 1990, JP-A 02 109371, Apr. 23,1990.

D.R. Disney, et al., Proceedings of the International Symposium on Power Semiconductor Devices, pp. 405–410, "A Trench–Gate Ligbt Structure and Two LMCT Structures in SOI Substrates".

1992 IEEE IEDM Technical Digest p. 229–232, "Prospects of High Voltage Power ICs on Thin SOI (Invited Paper)", Akio Nakagawa et al., Dec. 1992.

Proceedings of 1995 ISPSD p.141–145, "A Trench–Gate Injection Enhanced Lateral IEGT on SOI". Tomoko Matsudai et al., May 1995.

*Primary Examiner*—Wael Fahmy
*Attorney, Agent, or Firm*—Oblon, Spivak, McClelland, Maier & Neustadt, P.C.

[57] ABSTRACT

A sub-gate electrode is arranged to face, through a gate insulating film, a surface of a first p-type base layer which is interposed between a first n-type source layer and an n-type drift layer, and a surface of a second p-type base layer which is interposed between a second n-type source layer and the n-type drift layer and faces the first p-type base layer. A main gate electrode is arranged to face, through a gate insulating film, a surface of the second p-type base layer which is interposed between the second n-type source layer and the n-type drift layer and does not face the first p-type base layer. Three n-type MOSFETs are constructed such that one n-type channel is to be formed in the first p-type base layer and two n-type channels are to be formed in the second p-type base layer. The three channels are to be formed, so that the channel width is effectively enlarged and the current density is increased. The second p-type base layer has a length of 10 μm or less in the drifting direction.

14 Claims, 13 Drawing Sheets

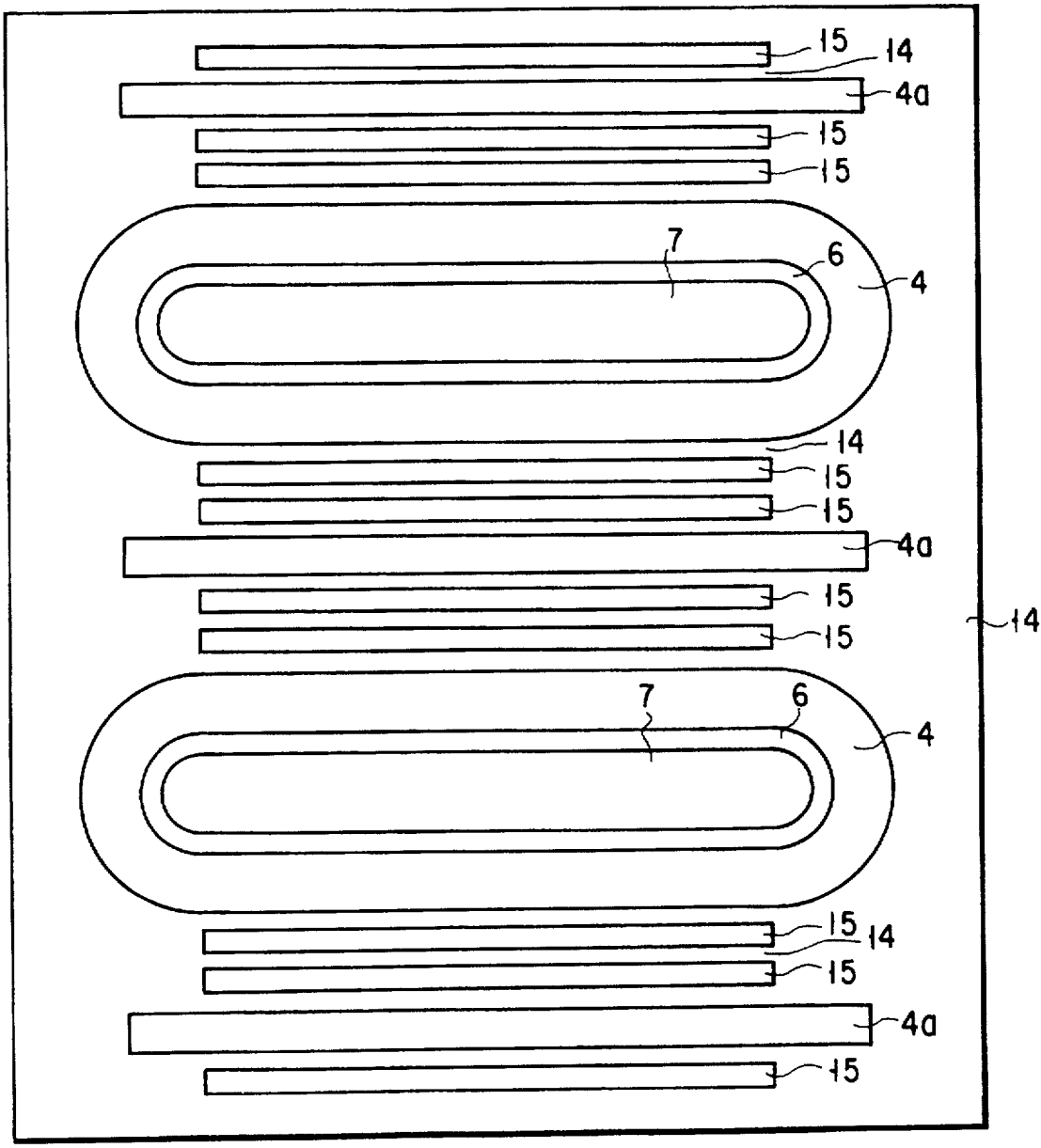
F I G. 17

LATERAL IGBT

BACKGROUND OF THE INVENTION

1. Field of the Invention

The present invention relates to a lateral IGBT (Insulated Gate Bipolar Transistor), and more particularly to a lateral IGBT employing an SOI (Semiconductor On Insulator) substrate.

2. Description of the Related Art

An IGBT is one of power semiconductor devices of the insulated gate type. The IGBT is a new power semiconductor device having both a high speed switching property of a power MOSFET and a high output property of a bipolar transistor. For this reason, in recent years, IGBTs are frequently used in the field of power electronics, such as an inverter, a switching power supply, or the like. Among the IGBTs, a lateral IGBT draws attention, since it is suitable for a high degree of integration level. In general, the lateral IGBT is formed, using an SOI substrate.

Where a large current is treated in power devices, such as an IGBT, the current capacity of a power output stage is important. A power stage having a current capacity of 1 A has been developed as a power stage of 500 V class. However, in order to treat a large current, a surface area of the power stage has to be formed larger in proportion to an increase of the necessary current capacity. For example, where 5 A is treated, the surface area of the power stage becomes five times larger, thereby making a chip bulky. Therefore, it is necessary to increase a current density per unit area and to keep a chip size compact so as to avoid the above described problem.

However, there is a problem in IGBTs, especially in a lateral IGBT, such that electron injection is not sufficient and thus its current density is hardly increased.

As described above, since an IGBT, which is one of the power devices, has both a high speed switching property and a high output property, it is employed in the field of power electronics. However, on the other hand, the IGBT has a problem such that its current density is hardly increased.

SUMMARY OF THE INVENTION

The present invention has been made in consideration of the above described problem, and an object of the present invention is to provide a lateral IGBT which has a large current density.

According to a first aspect of the present invention, there is provided a lateral IGBT comprising:

a drift layer of a first conductivity type formed by using a semiconductor active layer of a high resistance arranged on an insulating film;

a drain layer of a second conductivity type formed in a surface of the drift layer;

a base layer of the second conductivity type formed in a surface of the drift layer;

a source layer of the first conductivity type formed in a surface of the base layer;

a drain electrode arranged in contact with the drain layer;

a source electrode arranged in contact with the source and base layers; and a main gate electrode facing, through a gate insulating film, a surface of the base layer which is interposed between the source layer and the drift layer, and is located on a side facing the drain layer, wherein the base layer comprises first and second portions facing each other through an intervening portion which is part of the drift layer, the source layer comprises first and second portions respectively formed in surfaces of the first and second portions of the base layer, and a sub-gate electrode is arranged to face, through a gate insulating film, a surface of the first portion of the base layer which is interposed between the first portion of the source layer and the intervening portion, and a surface of the second portion of the base layer which is interposed between the second portion of the source layer and the intervening portion.

According to a second aspect of the present invention, there is provided a lateral IGBT comprising:

a drift layer of a first conductivity type formed by using a semiconductor active layer of a high resistance arranged on an insulating film;

a drain layer of a second conductivity type comprising first and second portions formed in a surface of the drift layer;

a base layer of the second conductivity type formed in a surface of the drift layer between the first and second portions of the drain layer;

a source layer of the first conductivity type formed in a surface of the base layer;

a drain electrode arranged in contact with the drain layer;

a source electrode arranged in contact with the source and base layers; and a main gate electrode comprising first and second portions facing, through a gate insulating film, surfaces of the base layer which are interposed between the source layer and the drift layer, and are located on sides facing the first and second portions of the drain layer, respectively, wherein the base layer comprises first and second portions facing each other through an intervening portion which is part of the drift layer, the source layer comprises first and second portions respectively formed in surfaces of the first and second portions of the base layer, and a sub-gate electrode is arranged to face, through a gate insulating film, a surface of the first portion of the base layer which is interposed between the first portion of the source layer and the intervening portion, and a surface of the second portion of the base layer which is interposed between the second portion of the source layer and the intervening portion.

It is preferable that the first and second portions of the base layer are arranged separate from each other along a first direction which is prevailing in lines connecting the drain layer and the source layer. The first direction can be considered as a prevailing direction along which electrons drift between the source and drain, i.e., drifting direction.

The main gate electrode and the sub-gate electrode may be integrally formed or independently formed.

In the IGBT according to the first aspect, one of the first and second portions of the base layer, which is more distant than the other from the drain layer, may be formed as islands, and the other may be formed as a strip.

According to the present invention, since a MOSFET constituted by a sub-gate electrode and so forth is added, a plurality of channels are arranged. As a result, the channel width is effectively enlarged, so that the channel resistance is lowered and the current density is increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 17 is a plan view schematically a lateral IGBT according to still another embodiment of the present invention.

DETAILED DESCRIPTION OF THE PREFERRED EMBODIMENTS

Figure 1:
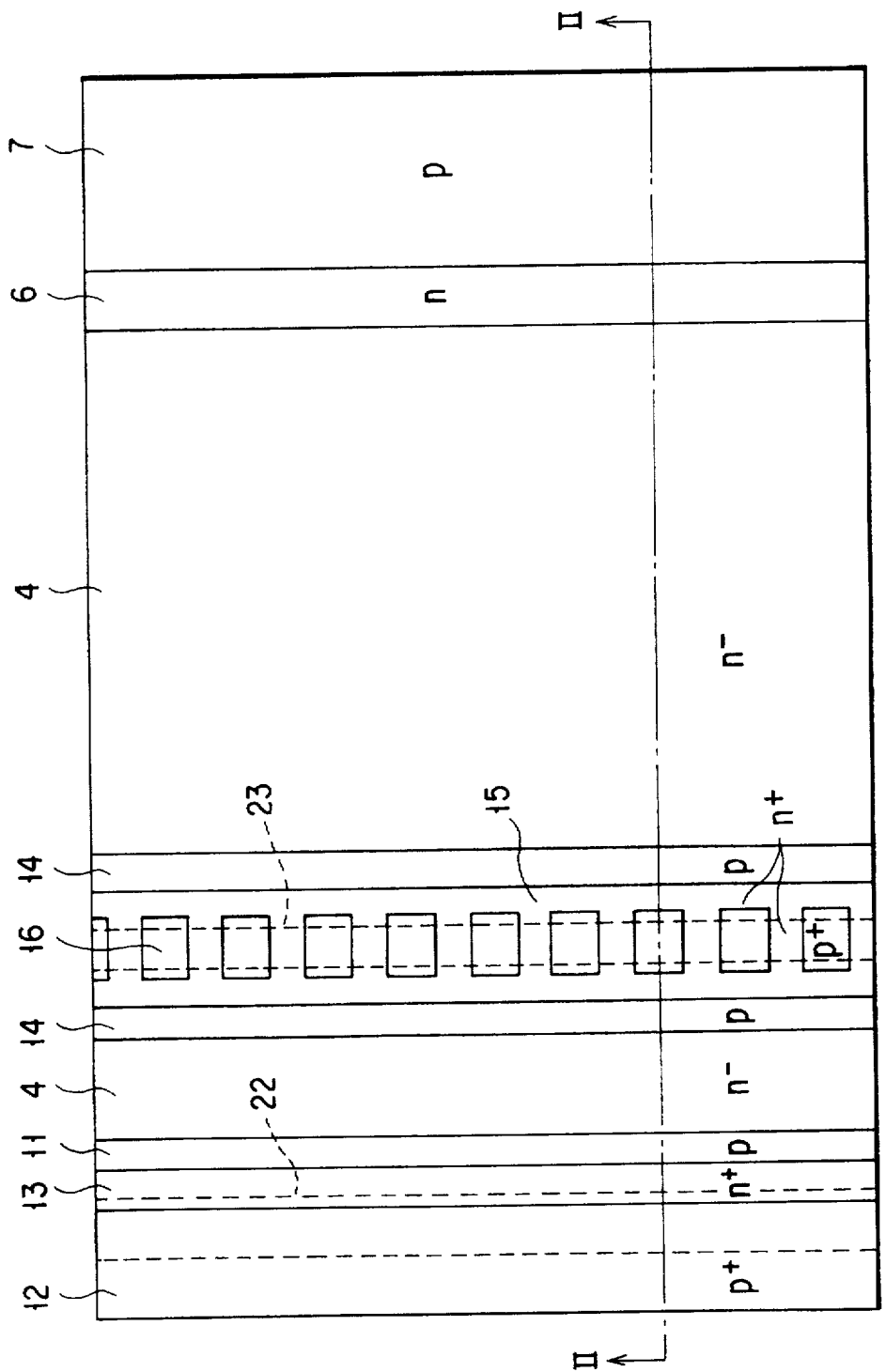
FIG. 1 is a plan view schematically a lateral IGBT according to an embodiment of the present invention.
Figure 2:
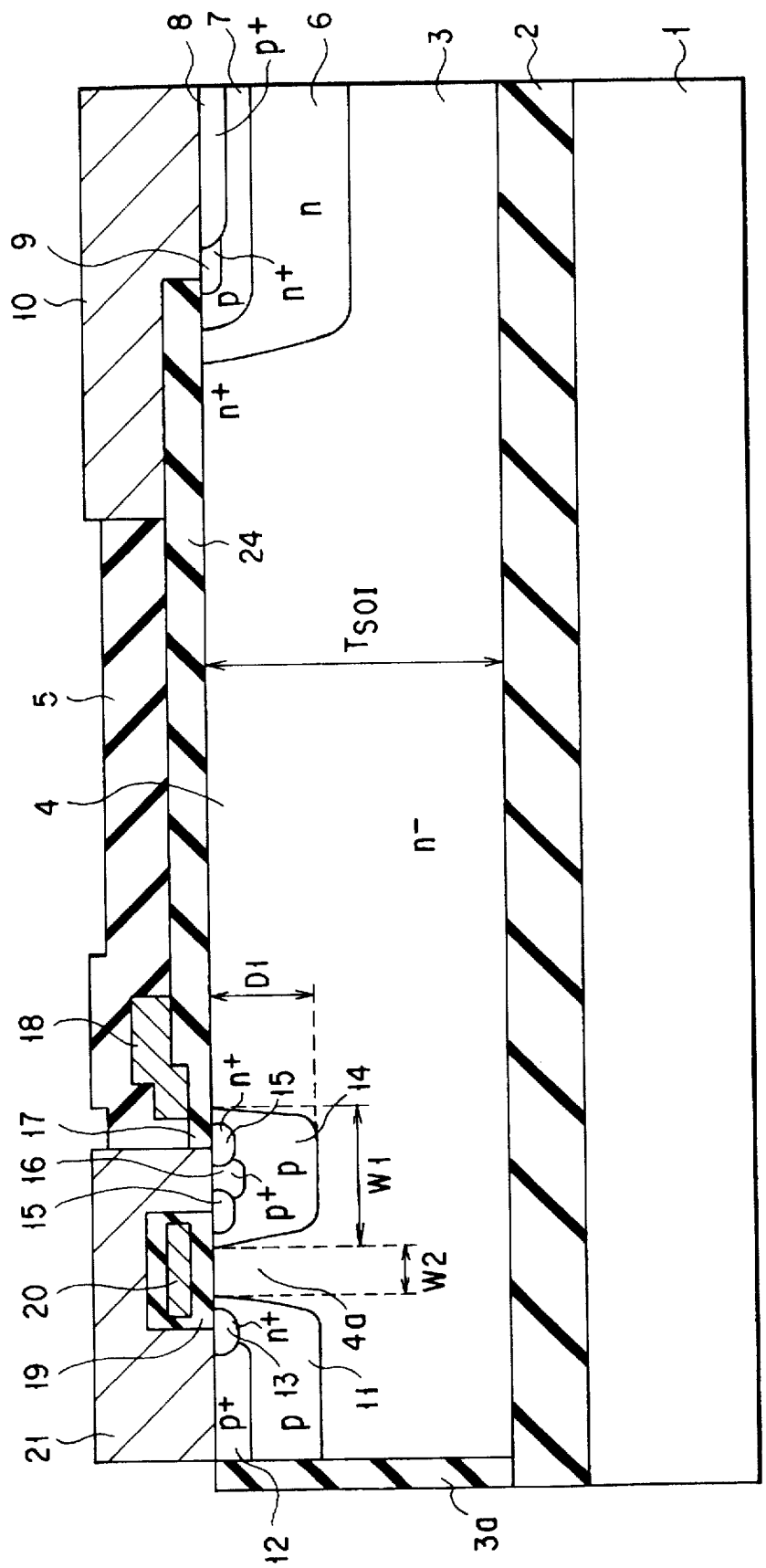
FIG. 2 is a cross sectional view schematically the lateral IGBT along line II—II in FIG. 1.

FIG. 1 is a plan view schematically a lateral IGBT according to an embodiment of the present invention, while FIG. 2 is a cross sectional view schematically the lateral IGBT along line II—II in FIG. 1.

An n-type silicon active layer (SOI semiconductor film) 3 having a high resistance (low concentration) is arranged on a silicon supporting body 1 through a silicon oxide film (SOI insulating film) 2. An SOI substrate is constituted by the silicon supporting body 1, silicon oxide film 2, and n-type silicon active layer 3.

The n-type silicon active layer 3 is used as an n-type drift layer 4. Note that it is not essential for the n-type drift layer 4 to be in direct contact with the silicon oxide film 2. For example, an n-type layer having a low resistance may be arranged in the n-type silicon active layer 3 between the n-type drift layer 4 and the silicon oxide film 2.

First and second p-type base layers 11 and 14 having a strip shape are selectively formed in the surface of the n-type drift layer 4 so as to sandwich therebetween an intervening portion 4a which is part of the n-type drift layer 4. First and second n-type source layers 13 and 15 having a low resistance (high concentration) are respectively and selectively formed in the surface of the first and second p-type base layer 11 and 14. The first n-type source layer 13 has a strip shape, while the second n-type source layer 15 has a strip shape resembling a ladder, as shown in FIG. 1.

The p-type base layers 11 and 14 are arranged separate from each other along a direction which is prevailing in lines connecting the n-type source layers 13 and 15 to a p-type drain layer described later. This separating direction can be considered as a prevailing direction along which electrons drift between the source and drain, i.e., drifting direction.

A main gate electrode 18 is arranged to face, through a gate oxide film 17, a surface of the second p-type base layer 14 which is interposed between the second n-type source layer 15 and the n-type drift layer 4. A sub-gate electrode 20 is arranged, through a gate oxide film 19, over a surface between the first and second n-type source layer 13 and 15. In other words, the sub-gate electrode 20 faces, through the gate oxide film 19, a surface of the first p-type base layer 11 which is interposed between the first n-type source layer 13 and the intervening portion 4a of the n-type drift layer 4, and also faces, through the gate oxide film 19, a surface of the second p-type base layer 14 which is interposed between the second n-type source layer 15 and the intervening portion 4a of the n-type drift layer 4.

In this embodiment, three n-type MOSFETs are constituted so as to form three n-type channels, one of which is in the first p-type base layer 11 while two of which are in the second p-type base layer 14.

The main gate electrode 18 and sub-gate electrode 20 may be formed integral, or may be formed independent of each other with, e.g., an Al wiring layer electrically connecting them.

A source electrode 21 is arranged on the first and second n-type source layers 13 and 15 and the first and second p-type base layers 11 and 14. The source electrode 21 is in contact with the first p-type base layer 11 through a p-type contact layer 12 having a low resistance, and is also in contact with the second p-type base layer 14 through a p-type contact layer 16 having a low resistance.

An n-type buffer layer 6 is selectively formed in the n-type drift layer 4 and is separated from the p-type base layer 14 by a predetermined distance. A p-type drain layer 7 is selectively formed in a surface of the n-type buffer layer 6.

A p-type contact layer 8 and an n-type layer 9 each having a low resistance are selectively formed in the surface of the p-type drain layer 7. A drain electrode 10 is arranged on the p-type contact layer 8 and the n-type layer 9. The drain electrode 10 is in contact with the p-type drain layer 7 through the p-type contact layer 8. The n-type layer 9 works for decreasing the drain injection efficiency, i.e., injection efficiency of holes from the p-type drain layer 7, so that a turn-off operation is performed at a high speed.

In FIGS. 1 and 2, there are also shown an embedded insulating film 3a for trench isolation, insulating films (oxide films) 5 and 24, and contact holes 22 and 23 for forming contacts between the p-type base layer 11 and the source electrode 21 and between the p-type base layer 14 and the source electrode 21, respectively.

The contact hole 23 is strip shaped. With this arrangement, since the second n-type source layer 15 has a ladder shape, the width W1 of the p-type base layer 14 can be small. The contact hole 22 is also strip shaped.

In this embodiment, three n-type channels can be formed by the three n-type MOSFET formed of the first and second p-type base layers 11 and 14 and so forth. As a result, the channel width is effectively increased thereby lowering the resistance of the channels as a whole, as compared with a conventional lateral IGBT which has only one n-type channel. It follows that the current density per unit surface area is increased, thereby allowing a chip size to be compact.

In this embodiment, the width W1 of the second p-type base layer 14 should be small for increasing the current density. More specifically, the width W1 is set preferably at 10 μm or less. Where the width is set at 6 μm or less, the current density becomes about twice as large.

The depth D1 of the second p-type base layer 14 should be small. The depth D1 is set preferably at 6 μm or less, and more preferably at 4 μm or less.

As the thickness $T_{SOI}$ of the n-type drift layer 4 grows larger, electrons from a channel more distant from the drain are caused to be injected more easily, thereby enhancing the effects of the present invention. The thickness $T_{SOI}$ is set preferably at 7 μm or more, and more preferably at 10 μm or more. By doing so, the effects of arranging a plurality of channels are further enhanced.

In relation to the width W1 of the second p-type base layer 14, the thickness $T_{SOI}$ should be set to satisfy $W1<T_{SOI}$. With this relationship, electrons injected into the n-type drift layer 4 from the n-type source layers 13 and 15 through the channels formed by the sub-gate electrode 20 are allowed to easily flow toward the drain. As a result, the ON voltage and ON resistance of the device are decreased.

The distance between the first and second p-type base layers 11 and 14, i.e., the width W2 of the intervening portion 4a is set preferably at 7 μm or more, and more preferably at 10 μm or more. With this arrangement, resistance in the depth direction, i.e., vertical resistance, within the channel region is decreased, thereby improving device properties.

In relation to the depth D1 of the second p-type base layer 14, the width W2 should be set to satisfy $W2 \geq D1$. With this relationship, it is possible to decrease resistance in the depth direction within the intervening portion 4a, when a depletion layer is formed to extend from the p-type base layer into the n-type drift layer 4.

Where the gate oxide films 17 and 19 are set thin, the current during application of a high voltage is decreased, so that the device is hardly broken when a resistor connected to the device is short-circuited. More specifically, if the resistor is short-circuited, a power supply voltage is directly applied to the device. For example, a power supply of DC 300 V is used, a voltage drop of 300 V is caused in the device while the gates are turned on, thereby causing a large current to flow through the device. In order to protect the device from this large current, the device should limit the current flowing therethrough by itself.

Where the gate oxide films 17 and 19 are set thin, a gate voltage can be decreased, so that the ON resistance of the device is decreased. On the other hand, where a voltage drop within a channel formed by application of the gate voltage is beyond the gate voltage, the current flowing through the device is not increased any more. In other words, the current, which flows when the resistor is short-circuited, can be decreased by lowering the gate voltage. With a small current flowing through the device, the generated heat becomes small, so that the device is not broken for a short period of time. If a device protection circuit can detect this abnormal state and shut down the device within this short period of time, the device is not broken. This effect is enhanced, where the gate oxide films 17 and 19 are set at 60 nm or less, and more preferably at 30 nm or less.

A method of manufacturing the lateral IGBT according to the embodiment is as follows:

At first, the SOI substrate having the silicon substrate 1, silicon oxide film 2, and n-type silicon layer 3 is formed by means of a direct bonding method. The thickness of the n-type silicon layer 3 is set at, e.g., about 10 μm.

Then, trenches are formed in the n-type silicon layer 3 to reach the silicon oxide film 2, and the embedded insulating films 3a are formed in the trenches, so that a power device (IGBT) region, i.e., the drift layer 4 is isolated.

Then, the entire exposed surface of the n-type drift layer is oxidized to form a thin oxide film having a thickness of about 0.1 μm. Further, a nitride film is formed on the oxide film. Then, the oxide and nitride films are removed except for the source and drain regions.

Then, the overall surface is subjected to oxidation, so that the thick oxide film 24 having a thickness of about 1 μm is formed outside the regions where the nitride film is left.

Then, the nitride film is removed and the n-type buffer layer 6 is formed by means of diffusion. Then, the thin oxide film is removed and the gate oxide films 17 and 19 are formed.

Then, a polysilicon film is formed and patterned to form the gate electrodes 18 and 20.

Then, the p-type base layers 11 and 14, and p-type drain layer 7, which have a depth of about 4 μm, are formed, using the gate electrodes 18 and 20, and oxide film 24 as masks. Then, p-type contact layers 12 and 16 are formed by means of ion implantation of boron at a dose of $1 \times 10^{15}$ cm$^{-2}$.

Then, the n-type source layers 13 and 15, and the n-type layer 9 are formed by means of diffusion, and the p-type contact layer 8 is formed by means of diffusion, using the gate electrodes 18 and 20, and oxide film 24 as masks.

Then, the oxide film 5 is formed overall and patterned along with other insulating films, so that the contact holes are formed.

Finally, the drain and source electrodes 10 and 21 are formed to complete the lateral IGBT. The drain electrode 10 is formed such that the effect of a field plate is obtained.

Figure 3:
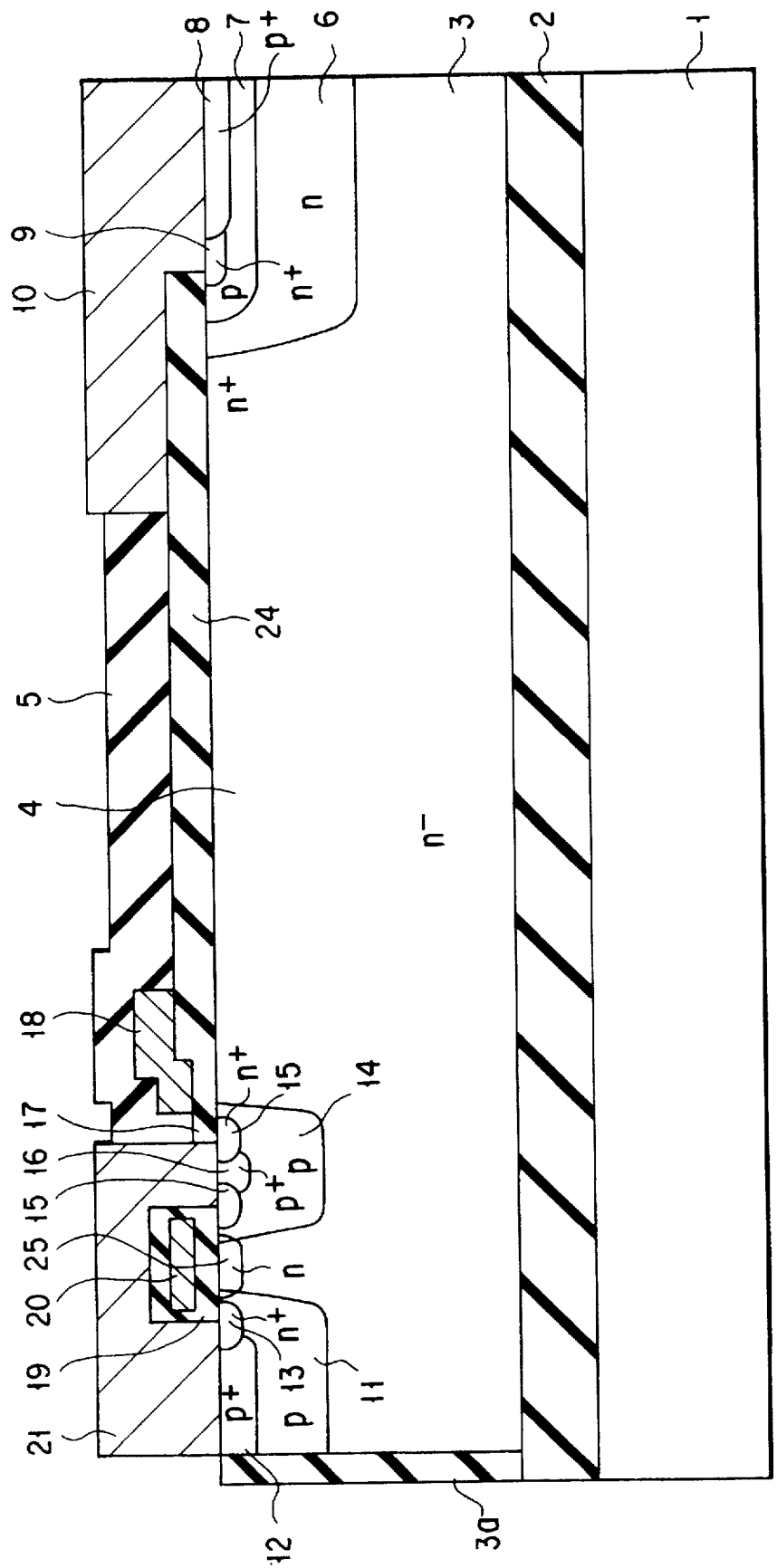
FIG. 3 is a cross sectional view schematically a lateral IGBT according to another embodiment of the present invention.

FIG. 3 is a cross sectional view schematically a lateral IGBT according to another embodiment of the present invention. In FIG. 3, the parts corresponding to those of the lateral IGBT shown in FIG. 2 are provided with reference symbols the same as those in FIG. 2, and their detailed explanation will be omitted. In the drawings after FIG. 3, this is done in the same manner.

The lateral IGBT according to this embodiment differs from the embodiment shown in FIG. 2 in that a shallow n-type diffusion layer 25 is formed in a surface of an intervening portion 4a arranged under a sub-gate electrode 20. With this arrangement, the gate region has a small resistance in the depth direction, so that the ON resistance of the device is decreased. The n-type diffusion layer 25 overlaps p-type base layers 11 and 14.

Figure 4:
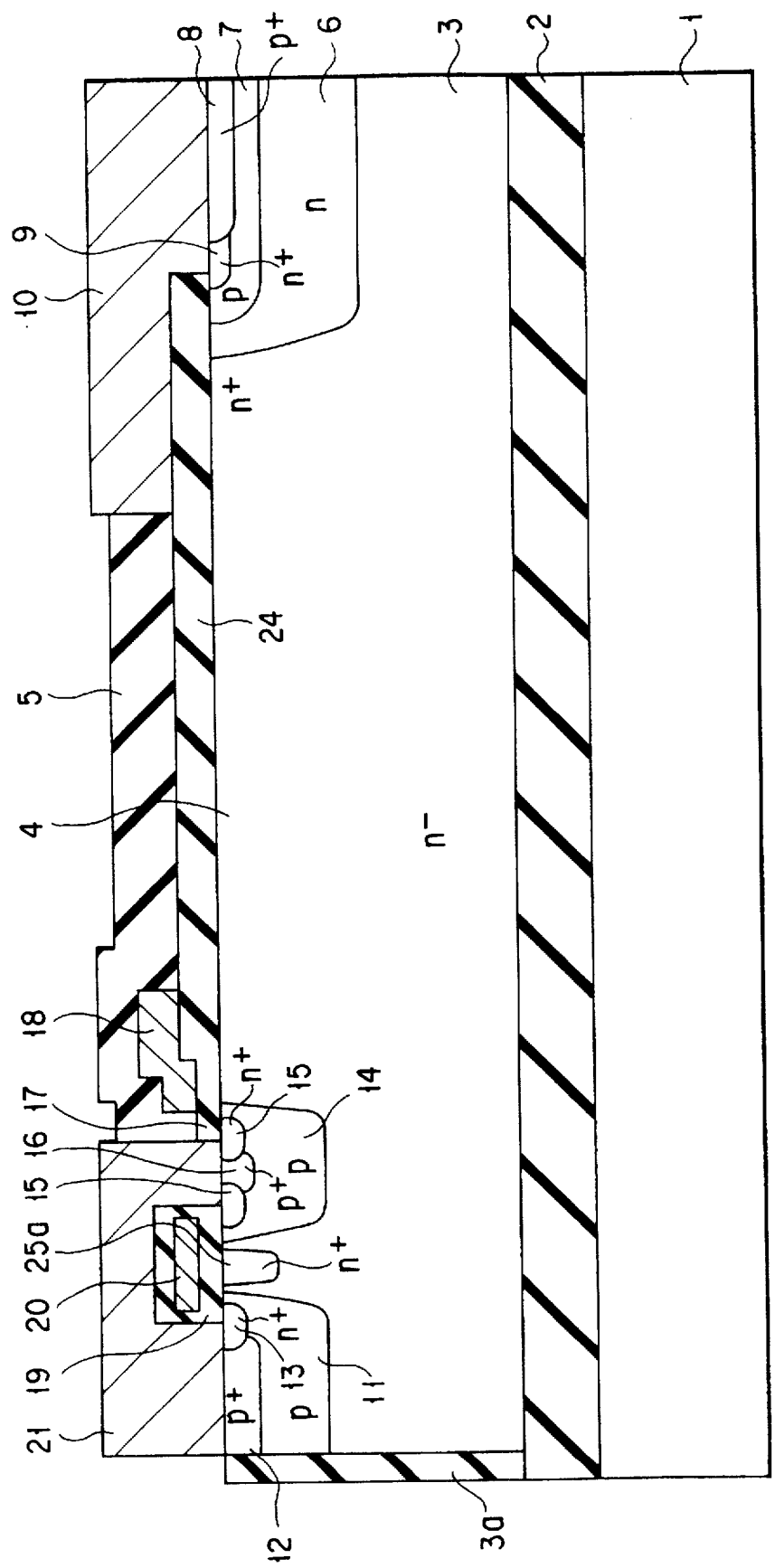
FIG. 4 is a cross sectional view schematically a lateral IGBT according to still another embodiment of the present invention.

FIG. 4 is a cross sectional view schematically a lateral IGBT according to still another embodiment of the present invention. The lateral IGBT according to this embodiment differs from the embodiment shown in FIG. 2 in that a deep n-type diffusion layer 25a having a low resistance is formed in a surface of an intervening portion 4a arranged under a sub-gate electrode 20. With this arrangement, the gate region has a small resistance in the depth direction, so that the ON resistance of the device is decreased. The n-type diffusion layer 25a does not overlap p-type base layers 11 and 14.

Figure 5:
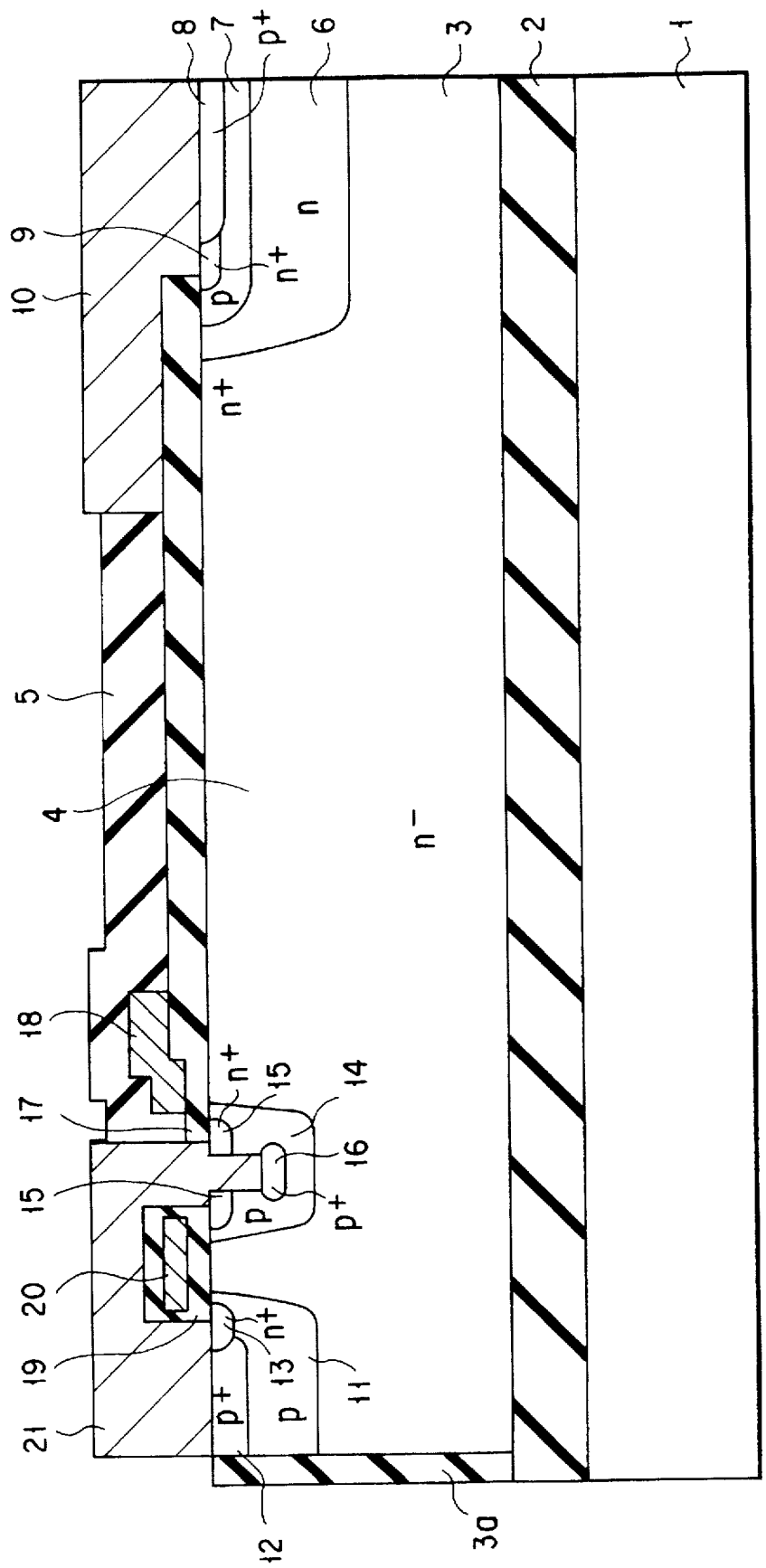
FIG. 5 is a cross sectional view schematically a lateral IGBT according to still another embodiment of the present invention.

FIG. 5 is a cross sectional view schematically a lateral IGBT according to still another embodiment of the present invention. The lateral IGBT according to this embodiment differs from the embodiment shown in FIG. 2 in that a source electrode 21 penetrates an n-type source layer 15 and is in contact with a p-type base layer 14 through a p-type contact layer 16. In other words, a contact between the source electrode 21 and the p-type base layer 14 is formed, using a shallow trench. With this arrangement, the p-type base layer 14 has a small resistance (lateral resistance) between the source electrode 21 and a portion right under the n-type source layer 15 closest to the drain, so that a latch-up phenomenon is effectively prevented.

Figure 6:
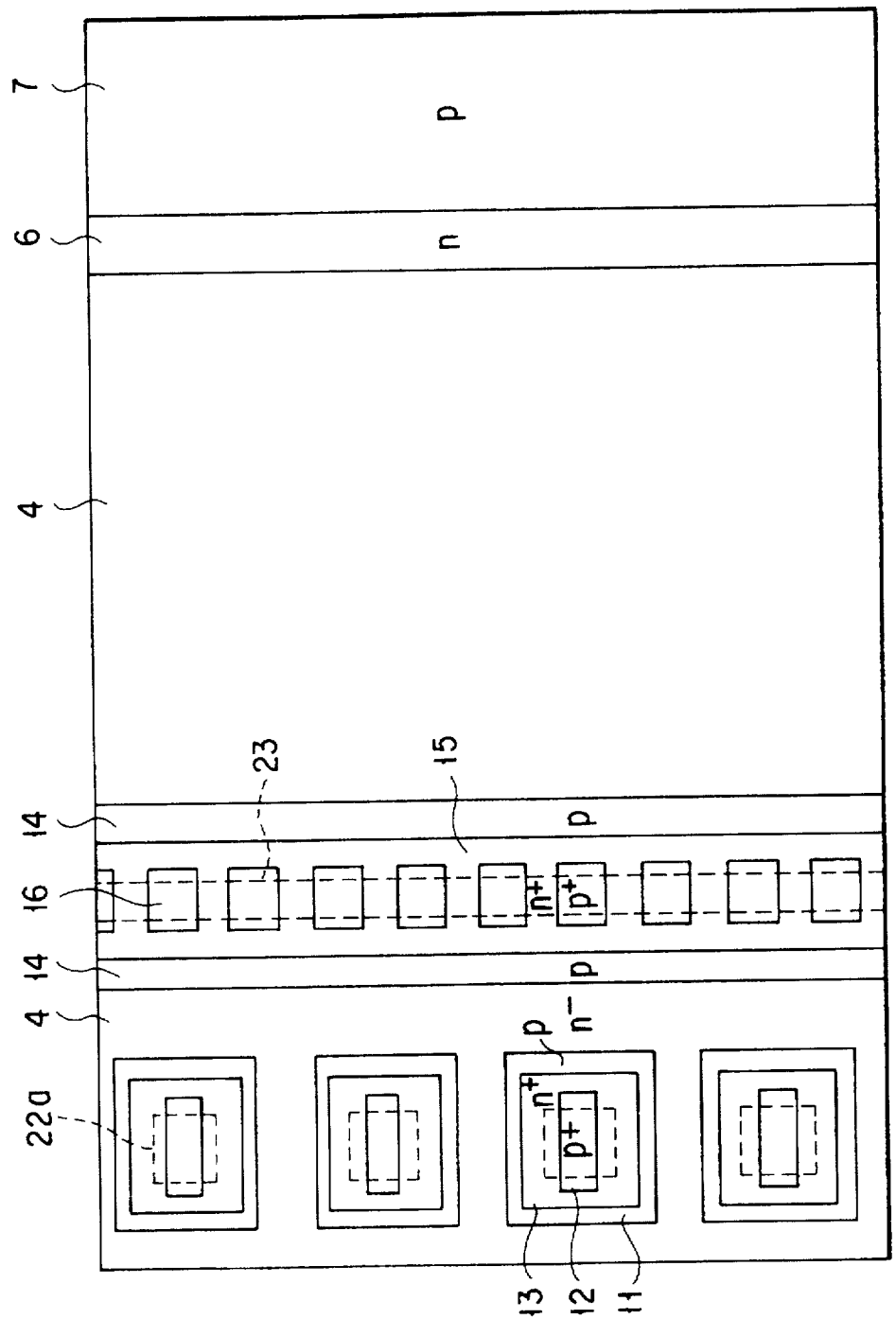
FIG. 6 is a plan view schematically a lateral IGBT according to still another embodiment of the present invention.

FIG. 6 is a plan view schematically a lateral IGBT according to still another embodiment of the present invention. The lateral IGBT according to this embodiment differs from the embodiment shown in FIG. 2 in that an n-type source layer 13 is formed as islands. With this arrangement, n-type channels are formed in a direction parallel to the drifting direction, as well as a direction perpendicular to the drifting direction, so that the channel width is increased and the ON resistance of the device is lowered, thereby improving the current driving performance.

Note that the present invention is not limited to the above described embodiments. For example, in the embodiments, there are two p-type base layers to increase the number of channels. The number of p-type base layers may be three or more to further increase the number of channels, so that the current density may be further increased.

As described above, a lateral IGBT according to the present invention, each of a p-type base layer and an n-type source layer has two portions facing each other with an intervening portion 4a, which is part of an n-type drift layer 4, interposed therebetween, and a sub-gate electrode 20 is arranged thereon, so that the channel resistance of the device is lowered as a whole. As a result, the lateral IGBT can increase the amount of current by 30% or more, as compared to a conventional IGBT having a main gate electrode only.

However, the surface area of the device is increased by a certain degree corresponding to the source region enlarged by adding the sub-gate electrode 20. Since the current density of a lateral device is defined on the basis of a surface area including the source, drift and drain regions, it is preferable to set the source region smaller in order to increase the current density.

Figure 7:
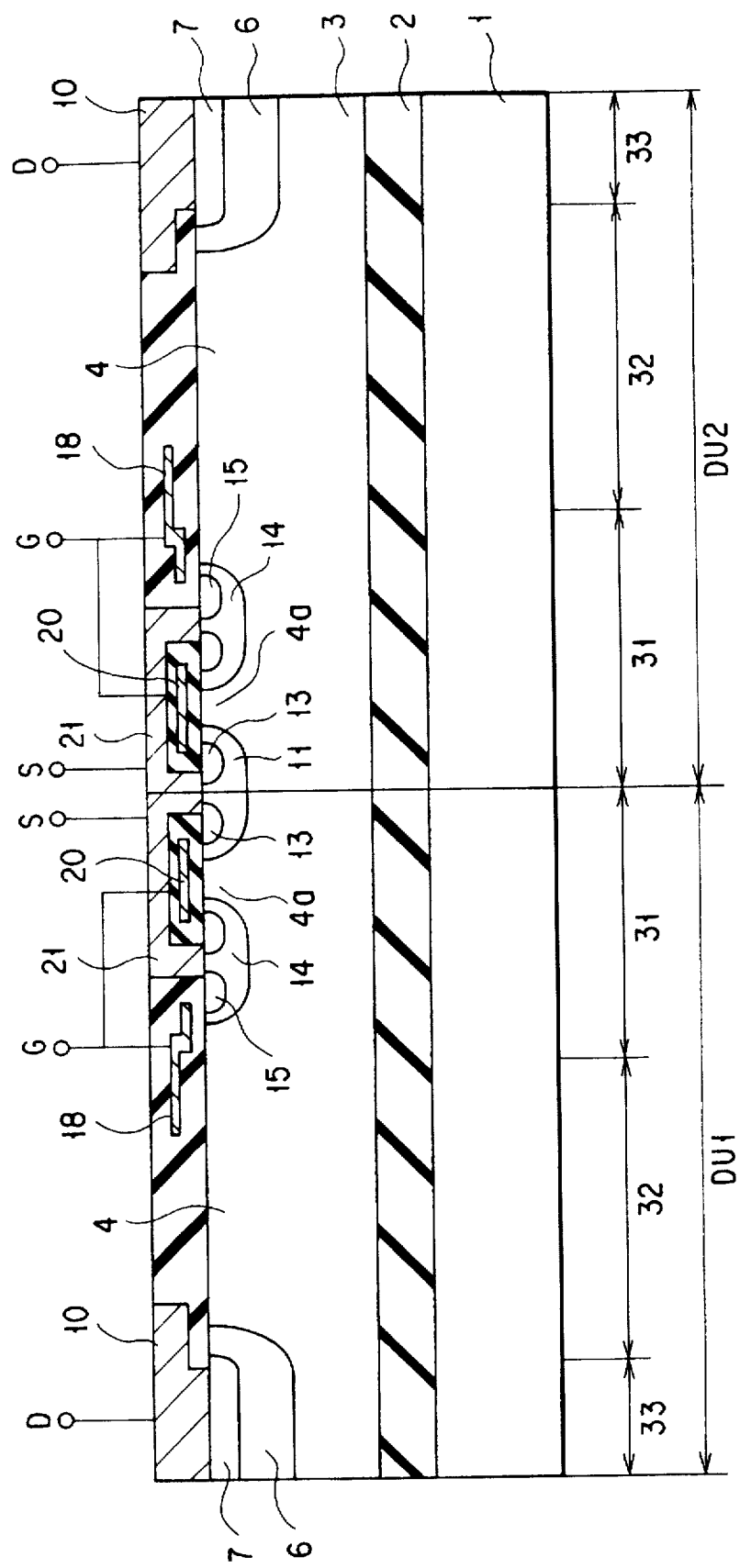
FIG. 7 is a cross sectional view schematically a lateral IGBT according to still another embodiment of present invention.
Figure 8:
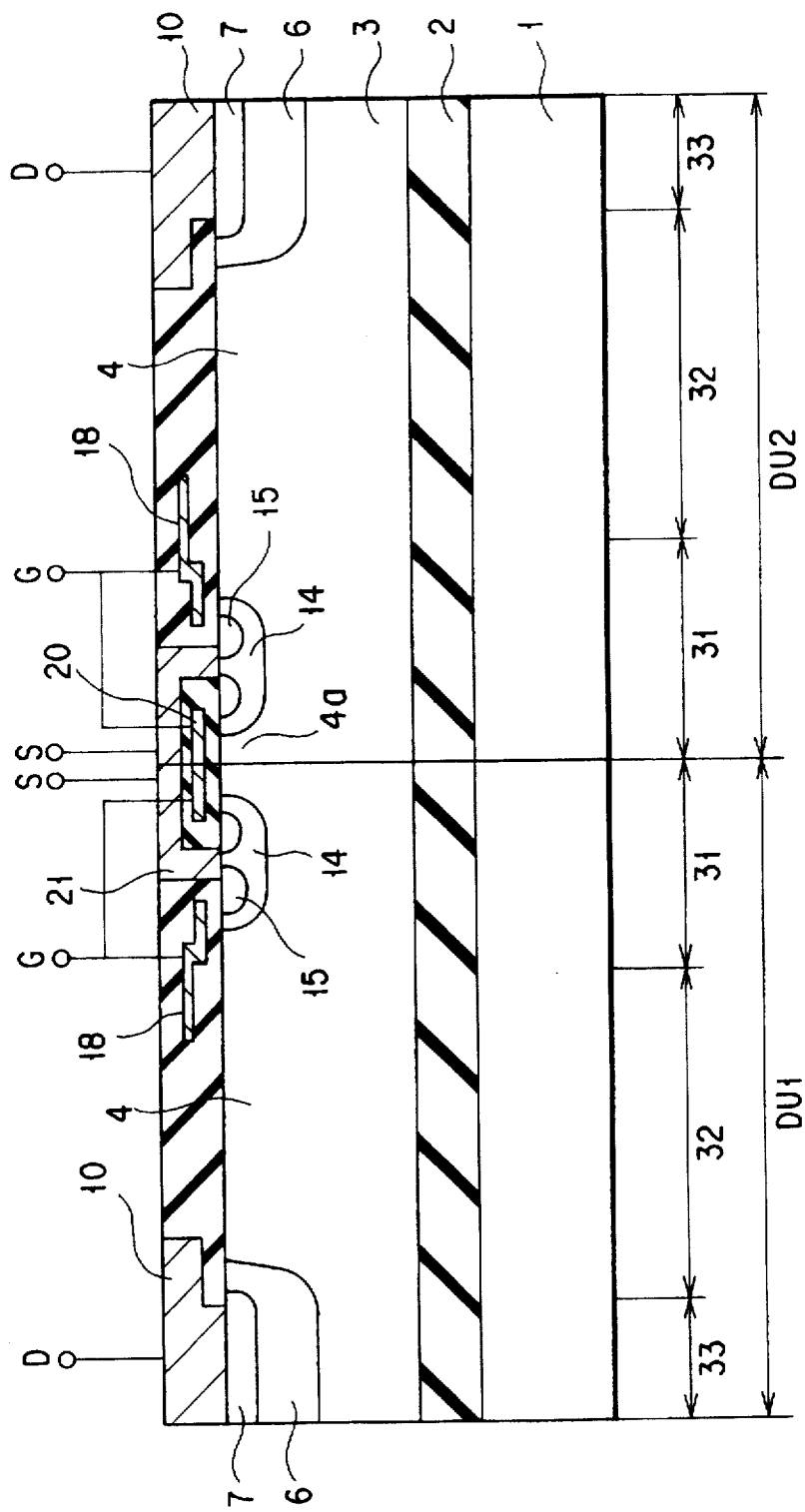
FIG. 8 is a cross sectional view schematically a lateral IGBT according to still another embodiment of the present invention.

For example, as shown in FIGS. 7 and 8, two different lateral IGBTs are provided according to still other embodiments of the present invention, each of which has first and second device units DU1 and DU2 arranged side by side.

In the embodiment shown in FIG. 7, each of the device units DU1 and DU2 has source, drift and drain regions 31, 32 and 33, as in the lateral IGBT shown in FIG. 2. In other words, each of the device units has three n-type MOSFETs, one of which corresponds to a main gate 18, and the other two correspond to a sub-gate electrode 20.

In contrast, in the embodiment shown in FIG. 8, the device units DU1 and DU2 commonly own an intervening portion 4a, which is part of an n-type drift layer 4, and a sub-gate electrode 20. In this case, the third n-type MOSFET of the device unit DU1, which is most distant from the drain region 33 of the device unit DU1, works as the second n-type MOSFET of the adjacent device unit DU2.

In other words, according to the embodiment shown in FIG. 8, a current flowing through a channel formed by the third n-type MOSFET of one device unit basically becomes a current flowing in an adjacent device unit. However, the amount of the current flowing through the third channel is much smaller than the amount of currents flowing through the first and second channels. Consequently, a voltage drop caused in each of the device units by commonly using the intervening portion 4a and the sub-gate electrode 20 is not so large. Instead, since the width of the source region is decreased with the current amount scarcely reduced, the current density is improved as a whole. Further, the currents respectively flowing through the channels become uniform, so that a latch-up phenomenon is hardly caused and the withstand capacity of the device upon short-circuiting of a resistor is increased. In the lateral IGBTs shown in FIGS. 7 and 8, each of the p-type base layer and the n-type source layer may be divided into two portions facing each other through the intervening portion 4a, as shown in FIGS. 1 and 6. Instead, the two portions of the p-type base layer facing each other through the intervening portion 4a may consist of two opposite portions of an integrated single layer.

Figure 9:
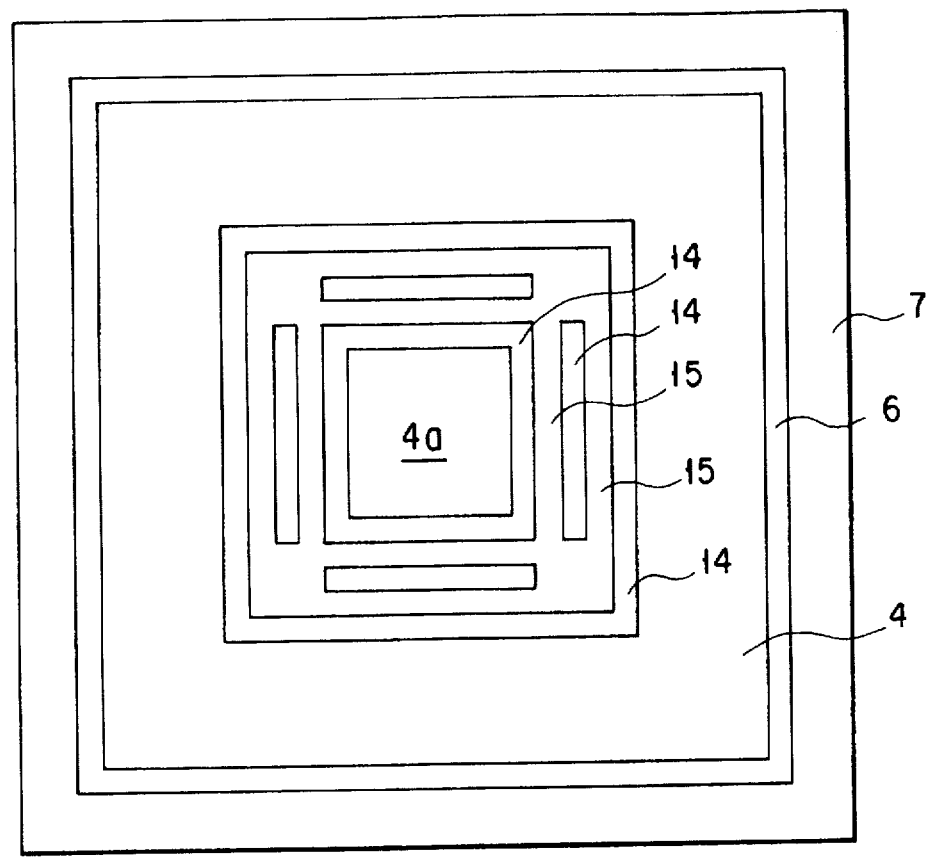
FIG. 9 is a plan view schematically a lateral IGBT according to still another embodiment of the present invention.

In a lateral IGBT shown in FIG. 9, according to still another embodiment of the present invention, an intervening portion 4a, which is part of an n-type drift layer 4, is arranged at the center, and a p-type base layer 14, an n-type source layer 15, the drift layer 4, a drain layer 7, and so forth, each having a ring shape, are coaxially arranged.

In a lateral IGBT shown in FIG. 17, according to still another embodiment of the present invention, a base layer 14 is formed to surround a drain layer 7. As compared to the structure shown in FIG. 9, the structure shown in FIG. 17 provides a higher withstand capacity against a latch-up phenomenon, so that it can be turned off even at a large current. The reason of this is as follows.

When the device is turned off, holes flow from a p-type drain layer 7, through an n-type drift layer 4 and a p-type base layer 14, into a source electrode 21. At this time, if the pn junction between the p-type base layer 14 and an n-type source layer 15 is forward-biased by the holes, electrons start being injected from the n-type source layer 15 so as to turn on a parasitic thyristor, thereby causing a latch-up phenomenon.

In the structure shown in FIG. 9, in which the p-type base layer 14 is surrounded by the p-type drain layer 7, since the p-type base layer 14 has a sharp corner again the flow of holes during turn off, a current concentration is caused when the holes flow into the p-type base layer 14. As a result, the pn junction is forward-biased by the holes so as to cause a latch-up phenomenon. Further, the contact length between the p-type base layer 14 and the source electrode 21 is smaller than the length of the channel region. As a result, resistance against the holes passing through the p-type base layer 14 is increased, so that the pn junction is further forward-biased to cause a latch-up phenomenon.

In contrast, in the structure shown in FIG. 17, in which the p-type drain layer 7 is surrounded by the p-type base layer 14, since the above described problems are solved, no latch-up phenomenon is caused.

Note that a cross sectional view of each of the lateral IGBTs shown in FIGS. 9 and 17 is substantially the same as that shown in FIG. 8.

Figure 10:
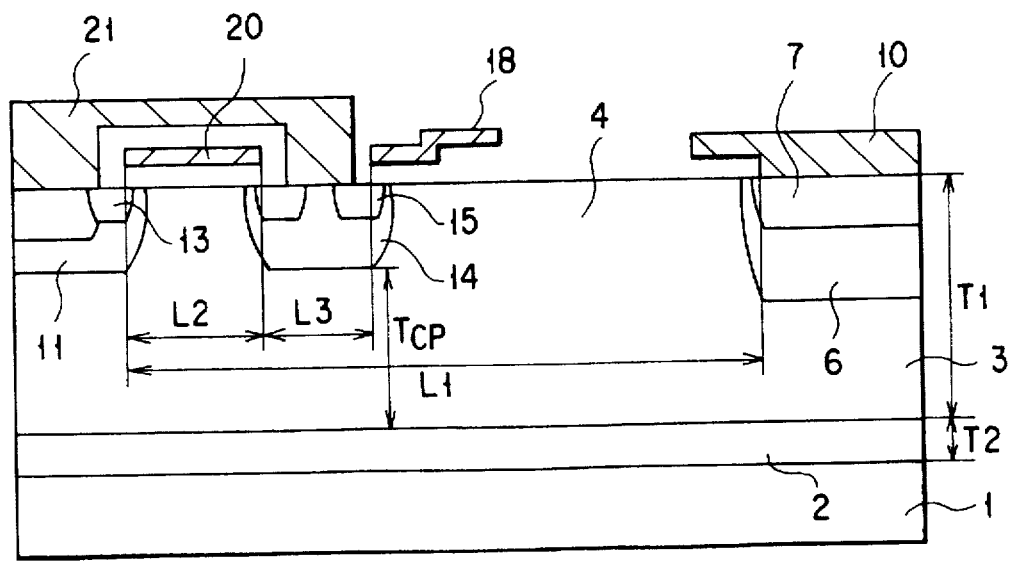
FIG. 10 is a cross sectional view schematically a reference structure of a device sample (lateral IGBT) for simulation.

An explanation will be give in relation to simulations of device samples, which were conducted, using a lateral IGBT shown in FIG. 10 as a reference structure, in order to confirm the effects of the present invention.

As shown in FIG. 10, a substrate having an n-type silicon active layer 3 arranged on a silicon supporting body 1 through a silicon oxide film 2 was used as a sample substrate for the simulations. A drifting length L1 was set at 60 µm, the thickness T1 of the active layer 3 at 15 µm, and the thickness T2 of the oxide film 2 at 3 µm (see FIG. 10), for obtaining a breakdown voltage of 500 V. The impurity concentration of the active layer 3 was set at $9.3 \times 10^{14}$ cm$^{-3}$, since it was known that a high breakdown voltage could be obtained at an implantation dose of about $1 \times 10^{12}$ cm$^{-2}$.

A preprocessor MEDIT was employed for forming device structure data. A two dimensional device simulator TONADDE2C was employed for simulating current-voltage characteristics. A post-processor VECTOR was employed for outputting current lines used for analyzing characteristics.

Current densities were calculated on the basis of a current per unit surface area over the length of one device unit, but not on the basis of a current per unit sectional area of the device.

Figure 11:
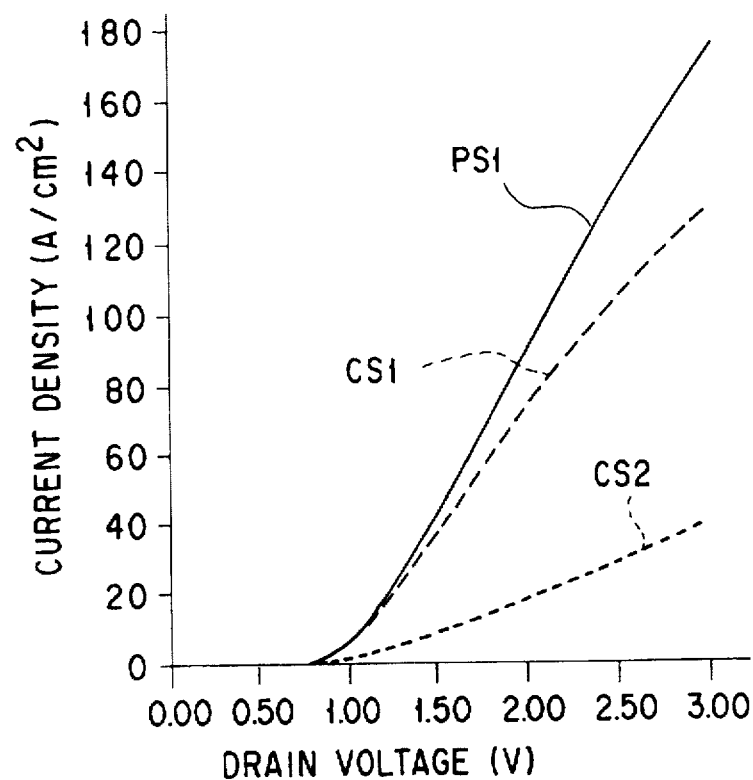
FIG. 11 is a graph showing a simulation result in terms of a characteristic of current densities to voltages.

FIG. 11 is a graph showing a simulation result in terms of a characteristic of current densities to voltages. Three lines shown in FIG. 11 denote characteristics of a present sample PS1 of the present invention having three channels formed by a main gate electrode 18 and a sub-gate electrode 20, a comparative sample CS1 having only one channel formed by the main gate electrode 18, and a comparative sample CS2 having only two channels formed by the sub-gate electrode 20, respectively. Each channel length was set at 1.0 µm, a sub-gate length L2 at 5 µm, and a gate-gap length L3 at 6 µm (see FIG. 10). Note that the sub-gate length L2 and the gate-gap length L3 were used as parameters approximate to the width W2 of the intervening portion 4a and the width W1 of the second p-type base layer 14, respectively, shown in FIG. 2.

As shown in FIG. 11, in the sample CS1 only having the main gate electrode 18 and corresponding to a conventional structure, a current density of 130 A/cm² was obtained. In the sample CS2 only having the sub-gate electrode 20, a current density as low as 30% of that of the sample CS1 was obtained. This was due to a drifting length substantially increased, though the number of channels of sample CS2 was twice as large as that of the sample CS1.

In contrast, in the sample PS1 of the present invention, a current density of 175 A/cm² was obtained. This current density of the sample PS1 was a value obtained by simply summing up the current densities of the samples CS1 and CS2.

Figure 12:
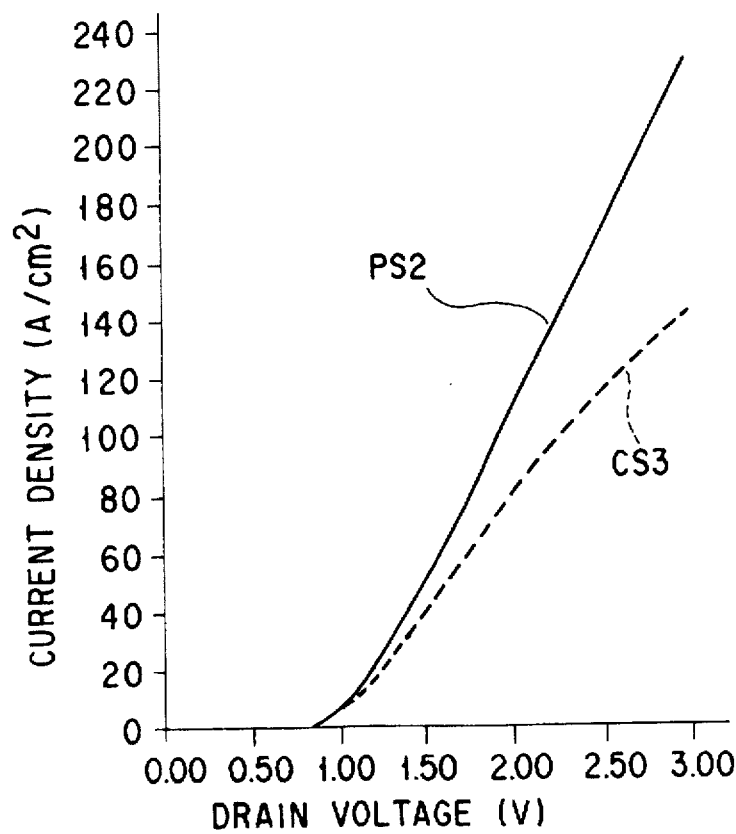
FIG. 12 is a graph showing another simulation result in terms of a characteristic of current densities to voltages.

FIG. 12 is a graph showing another simulation result in terms of a characteristic of current densities to voltages. Two lines shown in FIG. 12 denote characteristics of a present sample PS2 of the present invention having three channels formed by the main gate electrode 18 and the sub-gate electrode 20, and a comparative sample CS3 having only one channel formed by the main gate electrode 18, respectively. The simulation of FIG. 12 was conducted under conditions the same as those of the simulation of FIG. 11, except that the sub-gate length L2 was set at 10 µm and the concentration in the surface of the p-type base layer was set slightly high. Namely, each channel length was set at 1.0 µm, and the gate-gap length L3 at 6 µm.

As shown in FIG. 12, in the sample PS2 of the present invention, a current density of 230 A/cm² was obtained, and it was 162% of that produced by the sample CS3 (a conventional structure) having only one channel. From this result, it has been found that the current density is influenced to a great extent by a change of the sub-gate length L2.

Figure 13:
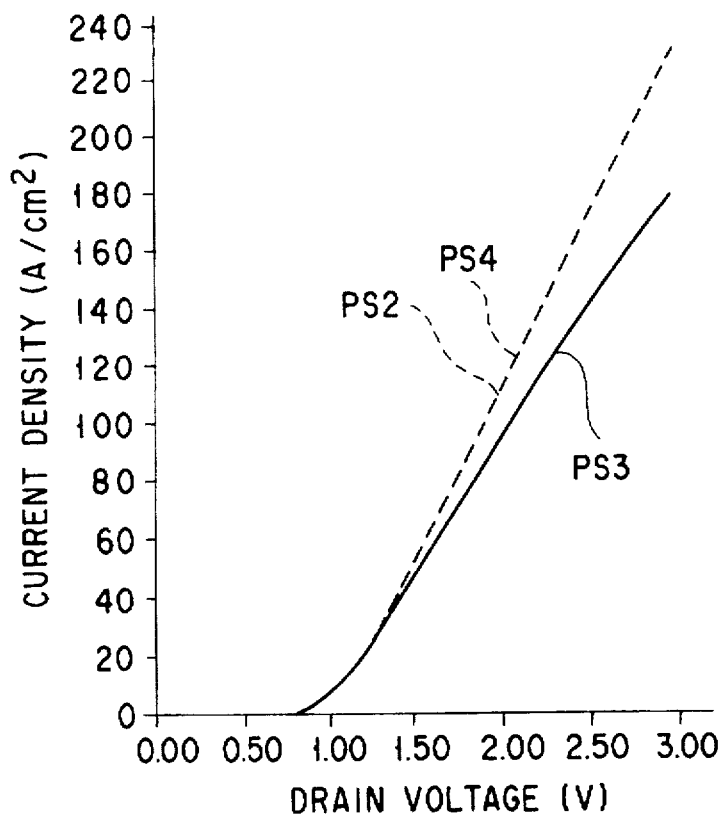
FIG. 13 a graph showing a simulation result in terms of the influence of the sub-gate length on a characteristic of current densities to voltages.

FIG. 13 is a graph showing a simulation result in terms of the influence of the sub-gate length L2 on a characteristic of current densities to voltages. Three lines shown in FIG. 13 denote characteristics of present samples PS2, PS3 and PS4, respectively, of the present invention having three channels formed by the main gate electrode 18 and the sub-gate electrode 20. The sub-gate length L2 was set at 10 µm, 5 µm and 15 µm in the samples PS2, PS3 and PS4, respectively. The simulation of FIG. 13 was conducted under conditions the same as those of the simulation of FIG. 12, except that the sub-gate length L2 was changed. Namely, each channel length was set at 1.0 µm, and the gate-gap length L3 at 6 µm.

As shown in FIG. 13, as compared to the sample PS2 having a sub-gate length L2 of 10 µm, a decrease in the current density was observed in the sample PS3 having a smaller sub-gate length L2 of 5 µm, but an increase in the current density was not observed in the sample PS4 having a larger sub-gate length L2 of 15 µm. This phenomenon is though to have been caused due to a reason as follows.

Under conditions of this simulation, the current passage has a thickness $T_{CP}$ (see FIG. 10) of 10 µm to 14 µm in the n-type drift layer 4 under the p-type base layers 11 and 14, judging from the active layer 3 having a thickness of 15 µm, and the p-type base layers 11 and 14 having a thickness of 1 µm to 5 µm. Therefore, where the sub-gate length L2 is set at 10 µm, the current passage has almost the same thicknesses under the p-type base layer 11 and 14, and right under the sub-gate electrode 20, i.e., at the intervening portion 4a. As a result, the sample PS2 produces a current density as large as 162% of that produced by the sample CS3 (a conventional structure).

On the other hand, where the sub-gate length L2 is decreased down to 5 µm, a current flow is obstructed when entering the sub-gate electrode 20. In other words, the current passage, which has a thickness of 10 µm to 14 µm under the p-type base layers 11 and 14, abruptly becomes narrower right under the sub-gate electrode 20, i.e., at the intervening portion 4a. As a result, an effect of the increased number of channels is not sufficiently utilized.

In contrast, where the sub-gate length L2 is increased up to 15 µm, the current passage becomes larger right under the sub-gate electrode 20, i.e., at the intervening portion 4a, but has a limited thickness under the p-type base layers 11 and 14. As a result, an effect of the large sub-gate length L2 is not sufficiently utilized.

In short, the thickness of the n-type drift layer 4 under the p-type base layer 11 and 14, and the width of the intervening portion 4a right under the sub-gate electrode 20 should be approximate to each other.

Figure 14:
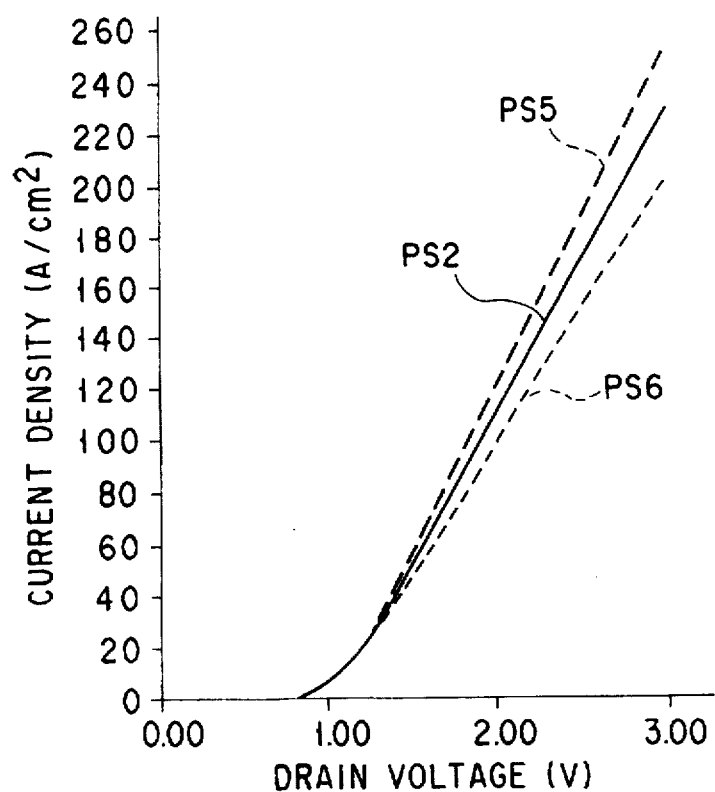
FIG. 14 is a graph showing a simulation result in terms of the influence of the gate-gap length on a characteristic of current densities to voltages.

FIG. 14 is a graph showing a simulation result in terms of the influence of the gate-gap length L3 on a characteristic of current densities to voltages. Three lines shown in FIG. 14 denote characteristics of present samples PS2, PS5 and PS6, respectively, of the present invention having three channels formed by the main gate electrode 18 and the sub-gate electrode 20. The gate-gap length L3 was set at 6 μm, 3 μm and 10 μm in the samples PS2, PS5 and PS6, respectively. The simulation of FIG. 14 was conducted under conditions the same as those of the simulation of FIG. 12, except that the gate-gap length L3 was changed. Namely, each channel length was set at 1.0 μm, and the sub-gate length L2 at 10 μm.

As shown in FIG. 14, as compared to the sample PS2 having a gate-gap length L3 of 6 μm, an increase in the current density was observed in the sample PS5 having a smaller gate-gap length L3 of 3 μm, and a decrease in the current density was observed in the sample PS6 having a larger gate-gap length L3 of 10 μm. The sample PS5 produced a current density as large as 118% of that produced by the sample PS6. From this result, it has been found that with a decrease in the gate-gap length L3, the drifting length is shortened so that a better result is obtained, as long as the sub-gate length L2 is set appropriately.

Figure 15:
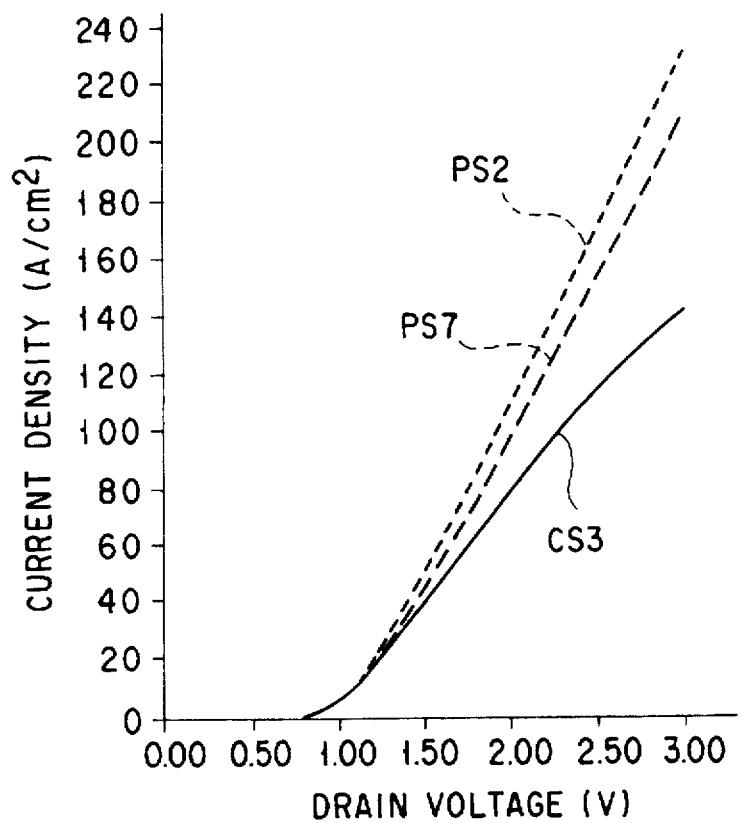
FIG. 15 is a graph showing a simulation result in terms of the influence of the number of channels (the number of MOSFETs) on a characteristic of current densities to voltages.

FIG. 15 is a graph showing a simulation result in terms of the influence of the number of channels (the number of MOSFETs) on a characteristic of current densities to voltages. Three lines shown in FIG. 15 denote characteristics of a present sample PS2 of the present invention having three channels formed by the main gate electrode 18 and the sub-gate electrode 20, a present sample PS7 of the present invention having five channels formed by the main gate electrode 18 and two sub-gate electrodes 20, and a comparative sample CS3 having only one channel formed by the main gate electrode 18, respectively. MOSFETs formed by the second sub-gate electrode 20 of the sample PS7 were arranged on a side distant from the drain. The simulation of FIG. 15 was conducted under conditions the same as those of the simulation of FIG. 12, except that the number of channels (the number of MOSFETs) was changed. Namely, each channel length was set at 1.0 μm, the sub-gate length L2 at 10 μm and the gate-gap length L3 at 6 μm.

As shown in FIG. 15, or as described above, the sample PS2 of the present invention having three channels produced a current density as large as 162% of that produced by the sample CS3 (a conventional structure) having only one channel. However, the sample PS7 of the present invention having five channels produced a current density lower than that of the sample PS2. This phenomenon is thought to have been caused due to the following reason.

Where the number of channels is five, the drifting length of two channels most distant from the drain is large, and the amount of a current flowing through the two channels into the second sub-gate electrode is very small. Further, where the number of channels is five, the entire length of the device, which is a parameter in calculation of the current density, is increased. As a result, the current density is decreased even though the number of channels is increased.

Figure 16:
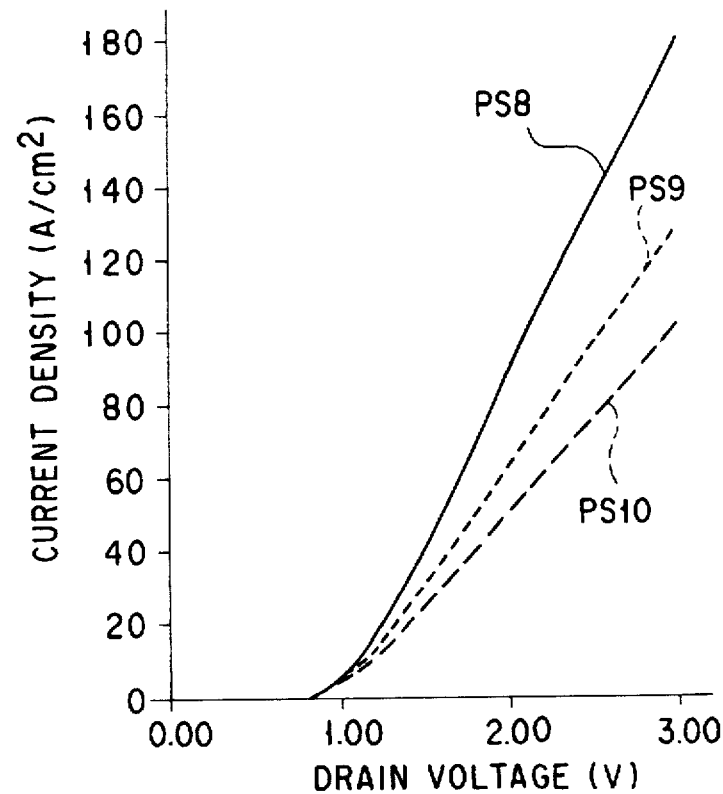
FIG. 16 is a graph showing a simulation result in terms of the influence of each channel length on a characteristic of current densities to voltages.

FIG. 16 is a graph showing a simulation result in terms of the influence of each channel length on a characteristic of current densities to voltages. Three lines shown in FIG. 16 denote characteristics of present samples PS8, PS9 and PS10, respectively, of the present invention having three channels formed by the main gate electrode 18 and the sub-gate electrode 20. Each channel length was set at 1.0 μm, 2.2 μm and 3.0 μm in the samples PS8, PS9 and PS10, respectively. The sub-gate length L2 was set at 12 μm in the samples PS8, PS9 and PS10. The simulation of FIG. 16 was conducted under conditions the same as those of the simulation of FIG. 12, except that each channel length and the sub-gate length L2 were changed. Namely, the gate-gap length L3 was at 6 μm.

As shown in FIG. 16, the current density was increased with a decrease in each channel length. From this result, it has been found that the current density can be greatly improved by adopting a short-channel structure in the device of the present invention.

Although a silicon film is used as an SOI semiconductor film in the above described embodiments, other semiconductor films may be used instead. Further, the features of the embodiments may be arbitrarily combined.

As described above, according to the present invention, since a MOSFET constituted by a sub-gate electrode and so forth is added, a plurality of channels are arranged. As a result, the channel width is effectively enlarged, so that the current density is increased.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A lateral IGBT comprising:

a drift layer of a first conductivity type formed by using a semiconductor active layer of a high resistance arranged on an insulating film;

a drain layer of a second conductivity type comprising first and second portions formed in a common surface of said drift layer;

a base layer of the second conductivity type formed in said common surface of said drift layer between said first and second portions of said drain layer;

a source layer of the first conductivity type formed in a surface of said base layer;

a drain electrode arranged in contact with said drain layer;

a source electrode arranged in contact with said source and base layers; and a main gate electrode comprising first and second portions facing, through a gate insulating film, surfaces of said base layer which are interposed between said source layer and said drift layer, and are located on sides facing said first and second portions of said drain layer, respectively, wherein said base layer comprises first and second portions facing each other through an intervening portion which is part of said drift layer, said source layer comprises first and second portions respectively formed in surfaces of said first and second portions of said base layer, and a sub-gate electrode is arranged to face, through a gate insulating film, a surface of said first portion of said base layer which is interposed between said first portion of said source layer and said intervening portion, and a surface of said second portion of said base layer which is interposed between said second portion of said source layer and said intervening portion.

2. The IGBT according to claim 1, wherein said first and second portions of said base layer are arranged separate from each other along a first direction connecting said drain layer and said source layer.

3. The IGBT according to claim 2, wherein a length of said base layer in said first direction between each of said first and second portions of said drain layer and said intervening portion is set smaller than a thickness of said drift layer.

4. The IGBT according to claim 2, wherein a length of said base layer in said first direction between said drain layer and said intervening portion is set at 10 μm or less.

5. The IGBT according to claim 2, wherein a length of said intervening portion in said first direction is set to be equal to or larger than a depth of the base layer.

6. The IGBT according to claim 2, each of said first and second portions of said source layer has a strip shape having a plurality of openings, through which said base layer is in contact with said source electrode.

7. The IGBT according to claim 2, wherein said base layer is formed to have a portion surrounding said drain layer.

8. The IGBT according to claim 1, further comprises a diffusion layer of the first conductivity type formed in said intervening portion and having a resistance lower than that of said drift layer.

9. The IGBT according to claim 1, wherein said source electrode comprises an extending portion arranged in a trench formed in said base layer, and is in contact with said base layer through said extending portion.

10. The IGBT according to claim 1, wherein said gate insulating films have a thickness less than 60 nm.

11. The IGBT according to claim 3, wherein a length of said base layer in said first direction between said drain layer and said intervening portion is set at 10 μm or less.

12. The IGBT according to claim 11, wherein a length of said intervening portion in said first direction is set to be equal to or larger than a depth of the base layer.

13. The IGBT according to claim 3, wherein a length of said intervening portion in said first direction is set to be equal to or larger than a depth of the base layer.

14. The IGBT according to claim 4, wherein a length of said intervening portion in said first direction is set to be equal to or larger than a depth of the base layer.

* * * * *